(12) United States Patent
Machida et al.

(10) Patent No.: US 7,140,785 B2
(45) Date of Patent: Nov. 28, 2006

(54) OPTICAL CONNECTOR ASSEMBLY

(75) Inventors: Yuichi Machida, Kanagawa (JP); Hisashi Tomita, Tokyo (JP); Tomoshi Hirayama, Tokyo (JP); Yoichi Mizutani, Saitama (JP); Masato Kajimoto, Chiba (JP); Tsutomu Sampei, Ibaraki (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/131,979

(22) Filed: May 18, 2005

(65) Prior Publication Data

US 2005/0271331 A1    Dec. 8, 2005

(30) Foreign Application Priority Data

May 20, 2004    (JP)    ............................. 2004-150859

(51) Int. Cl.
*G02B 6/36* (2006.01)
(52) U.S. Cl. ............................. 385/92; 385/88; 385/90; 385/53
(58) Field of Classification Search ................. 385/79, 385/83, 88
See application file for complete search history.

(56) References Cited

U.S. PATENT DOCUMENTS

| | | | | |
|---|---|---|---|---|
| 5,917,632 A | * | 6/1999 | Lesesky | 398/106 |
| 6,439,778 B1 | * | 8/2002 | Cairns | 385/60 |
| 6,459,843 B1 | * | 10/2002 | Igl et al. | 385/136 |
| 2004/0175068 A1 | * | 9/2004 | Meyer | 385/15 |

* cited by examiner

*Primary Examiner*—Frank G. Font
*Assistant Examiner*—Eric Wong
(74) *Attorney, Agent, or Firm*—Frommer Lawrence & Haug LLP; William S. Frommer; Paul A. Levy

(57) ABSTRACT

An optical connector assembly has a plug connector having a first optical element for performing emission or receipt of light and a first lens. It also has a receptacle connector having a second optical element for performing receipt or emission of light and a second lens. The plug connector includes a convex portion having sectional configuration of round arch and the first lens, and a plug portion formed on a forward end of the convex portion. The plug portion is perpendicular to first optical axis of the first optical element and the first lens. The receptacle connector includes a concave portion into which the convex portion is inserted and a receptacle portion in a bottom of the concave portion. The receptacle portion is perpendicular to second optical axis of the second optical element and the second lens. The plug or receptacle connector has supporting mechanism that supports the connector movably.

19 Claims, 10 Drawing Sheets

OPTICAL CONNECTOR ASSEMBLY

CROSS-REFERENCE TO RELATED APPLICATION

The present invention contains subject matter related to Japanese Patent Application JP 2004-150859 filed in the Japanese Patent Office on May 20, 2004, the entire contents of which being incorporated herein by reference.

BACKGROUND OF THE INVENTION

1. Field of the Invention

The present invention relates to optical connector assembly for connecting optical communication devices detachably to each other.

2. Related Art

Optical module having light-emitting element such as laser diode and light-receiving element such as photodetector has been known. Such the optical module has optical connector assembly to be connected to another apparatus (see Japanese unexamined Patent Publication No. 2004-126098.

FIG. 1 illustrates a side sectional view showing a configuration of the past optical connector assembly. The past optical connector assembly 1 includes a plug connector 2 having a laser diode 3, for example, and a receptacle connector 4 having a photodetector 5, for example. The plug connector 2 has a lens 6 inside a cylindrical body 7 thereof. An axis of the body 7 is parallel with an optical axis of the lens 6. The receptacle connector 4 has a lens 8 inside a cylindrical body 9 into which the body 7 is inserted. An axis of the body 9 is parallel with an optical axis of the lens 8.

Accuracy of an outer diameter $\phi d$ of the body 7 and an inner diameter $\phi D$ of the body 9 is adjusted to a micron-order. A length of a part L in the body 9 into which the body 7 is inserted is made longer to prevent the optical axis of the receptacle connector 4 from being inclined with respect to the plug connector 2.

FIGS. 2A through 2C illustrate connection of such the optical connector assembly to describe accuracy necessary for fitting optical axes of their lenses. Herein, it is assumed that the optical connector assembly includes an output optical system 10 having the laser diode 3 and the lens 6 and an input optical system 11 having the photodetector 5 and the lens 8.

As shown in FIG. 2A, if optical axis P1 of the output optical system 10 coincides with optical axis P2 of the input optical system 11, laser light emitted from the laser diode 3 is focused on the photodetector 5.

As shown in FIG. 2B, however, if the optical axis P1 of the output optical system 10 is parallel shifted to the optical axis P2 of the input optical system 11, laser light emitted from the laser diode 3 is focused on the photodetector 5 with an amount of light received by the photodetector 5 being decreased.

As shown in FIG. 2C, if the optical axis P1 of the output optical system 10 is shifted to the optical axis P2 of the input optical system 11 in their inclined manner, laser light emitted from the laser diode 3 cannot be focused on the photodetector 5.

What is necessary is rigid accuracy on inclination between the optical axes in the optical connector assembly.

SUMMARY OF THE INVENTION

In the past optical connector assembly, fitting a part having rigid accuracy into a part having rigid accuracy implements optical axes alignment. This results in necessity of rigid accuracy processing in the optical connector assembly, thereby utilizing special processing techniques and selecting special material, which increases the costs therefor.

When attaching and detaching the optical connector assembly, it is difficult for the optical connector assembly to be easily attached or detached because a part thereof having rigid accuracy is fitted into a part having rigid accuracy.

While repeating to attach and detach the optical connector assembly, by abrasion or deformation based on sliding friction, it has been difficult to keep its intended processing accuracy, thereby preventing an inclination of optical axis from being restrained in intended limits. Thus, when the past optical connector assembly is used in an apparatus where it is repeatedly attached or detached at frequent intervals, it may be difficult to keep its endurance and reliability good.

It is desirable to provide an optical connector assembly and the like having excellent endurance at low cost.

According to an embodiment of the present invention, there is provided an optical connector assembly that connects optical communication devices detachably to each other. The assembly has a plug connector having a first optical element for emitting or receiving light, and a first lens. The first optical element and the first lens have a first optical axis identical to each other. The assembly also has a receptacle connector having a second optical element for performing receipt or emission of light, and a second lens. The second optical element and the second lens have a second optical axis identical to each other. In the assembly, the plug connector includes a convex portion having sectional configuration of round arch a diameter of which is gradually diminished along the first optical axis, and a plug portion formed on a forward end of the convex portion. The plug portion is perpendicular to the first optical axis. The receptacle connector includes a concave portion into which the convex portion is inserted and a receptacle portion formed in a bottom of the concave portion. The receptacle portion is perpendicular to the second optical axis. The plug or receptacle connector has supporting mechanism that supports the connector movably.

In an embodiment of the optical connector assembly according to the present invention, the plug connector and the receptacle connector are roughly aligned and fitted into each other. Then, the convex portion of plug connector and the concave portion of receptacle connector are fitted so that the plug connector and the receptacle connector can be relatively move to directions that their first and second optical axes are identical to each other according to a guide of the convex portion of plug connector. Further, the plug portion of plug connector and the receptacle portion of receptacle connector are attached to each other.

Since the plug portion is perpendicular to the first optical axis of the first optical element and the first lens and the receptacle portion is also perpendicular to the second optical axis of the second optical element and the second lens, when the plug portion and the receptacle portion are attached, the first and second optical axes are arranged so that they are parallel to each other.

Thus, when the plug connector and the receptacle connector are roughly aligned and fitted into each other, the first optical axis of the first optical element and the first lens almost coincide with the second optical axis of the second optical element and the second lens, not inclined.

According to another embodiment of the invention, there is also provided an optical communication device that performs optical communication, having an optical connector assembly. The assembly has a plug connector having an optical element for emitting or receiving light and a lens. The optical element and the lens have an optical axis identical to each other. The plug connector includes a convex portion having sectional configuration of round arch a diameter of which is gradually diminished along the optical axis, and a plug portion formed on a forward end of the convex portion. The plug portion is perpendicular to the optical axis.

In an embodiment of the optical communication device according to the present invention, when the plug connector is fitted into a receptacle connector to be connected of a target optical communication device, the convex portion of plug connector allows axes of the optical element and an optical element of the target optical communication device to be aligned. When this plug portion and a receptacle portion of the target optical communication device are attached, the optical axis of this optical communication device and the optical axis of the target optical communication device are arranged so that they are parallel to each other.

According to further embodiment of the invention, there is also provided an optical communication device that performs optical communication, having an optical connector assembly. The assembly has a receptacle connector having an optical element for emitting or receiving light and a lens. The optical element and the lens have an optical axis identical to each other. The receptacle connector includes a concave portion and a receptacle portion formed in a bottom of the concave portion. The receptacle portion is perpendicular to the optical axes.

In an embodiment of the optical communication device according to the present invention, when a plug connector of a target optical communication device is fitted into the concave portion of this receptacle connector, the concave portion of this receptacle connector and a convex portion of the plug connector allow the optical element of this optical communication device and an optical element of a target optical communication device to be aligned. When the plug portion of this optical communication device and the receptacle portion of the target optical communication device are attached, the optical axis of this optical communication device and the optical axis of the target optical communication device are arranged so that they are parallel to each other.

According to the above embodiments of the present invention, when the plug connector and the receptacle connector are roughly aligned and fitted into each other in the optical connector assembly, they are connected so that optical communication can be performed. This allows attachment or detachment of the optical connector assembly to be easily performed at a short time.

If the plug portion of the plug connector and the receptacle portion of the receptacle connector have considerable accuracy relative to their respective optical axes of the optical element and the lens, alignment accuracy relative to inclination of any optical axes is maintained so that it is possible to provide an optical connector assembly having excellent accuracy at low cost.

Further, when attaching and detaching the plug connector to and from the receptacle connector, the plug portion and the receptacle portion are attached to each other by only the surfaces thereof so that if attaching and detaching operations are repeated, little abrasion such that position alignment can be decreased occurs, thereby improving the endurance thereof.

Since the plug connector has the optical element and the lens as well as the receptacle connector has the optical element and the lens, the optical elements that are positioned near to each other can be communicated with each other when inserting the plug connector into the receptacle connector.

Thus, such the optical system can be easily composed, thereby allowing the lightweight optical connector assembly to be provided at low cost. When a laser is used as the optical element, optical communication can be performed using the laser of class 1, thereby improving its safety.

Further, in the optical communication devices including such the optical connector assembly, even when attaching and detaching operations are repeated, accuracy of the optical connector assembly can be maintained for a long time and the optical connector assembly can be also provided at low cost so that it is possible to provide the optical communication device having excellent endurance at low cost.

The concluding portion of this specification particularly points out and directly claims the subject matter of the present invention. However those skill in the art will best understand both the organization and method of operation of the invention, together with further advantages and objects thereof, by reading the remaining portions of the specification in view of the accompanying drawing(s) wherein like reference characters refer to like elements.

DESCRIPTION OF THE INVENTION

The following will describe embodiments of an optical connector assembly and optical communication devices in accordance with accompanying drawings.

Figure 3:
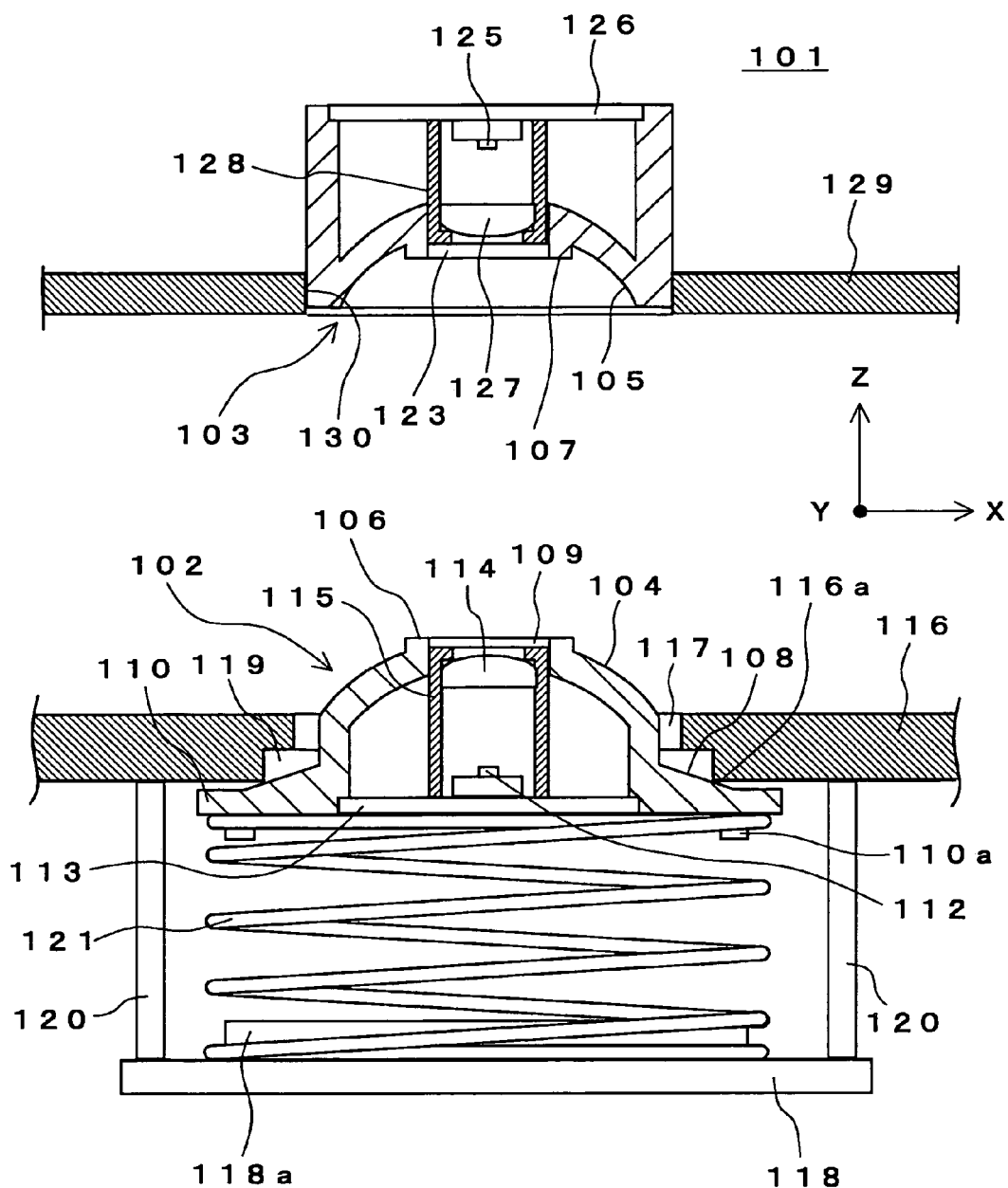
FIG. 3 is a diagram for showing a configuration of an embodiment of an optical connector assembly according to the invention.

FIG. 3 shows a configuration of a first embodiment of an optical connector assembly according to the invention. According to the first embodiment of the invention, the optical connector assembly 101 has a plug connector 102 and a receptacle connector 103. The plug connector 102 includes a convex portion 104 having sectional configuration of round arch a diameter of which is gradually diminished toward a forward end thereof, and a plug portion 106 formed on a forward end thereof. The receptacle connector 103 includes a concave portion 105 into which the convex portion 104 of the plug portion 102 is inserted and a receptacle portion 107 formed in a bottom of the concave portion 105. In this case, the plug connector 102 can be moved.

When the convex portion 104 of the plug portion 102 and the concave portion 105 of the receptacle connector 103 are fitted, position alignment is performed using as a guide a spherical surface of the convex portion 104 so that the plug portion 106 of the plug connector 102 and a receptacle portion 107 of the receptacle connector 103 can be attached to each other. This allows the connection therebetween to be implemented without any inclination of the optical axes.

Figure 4:
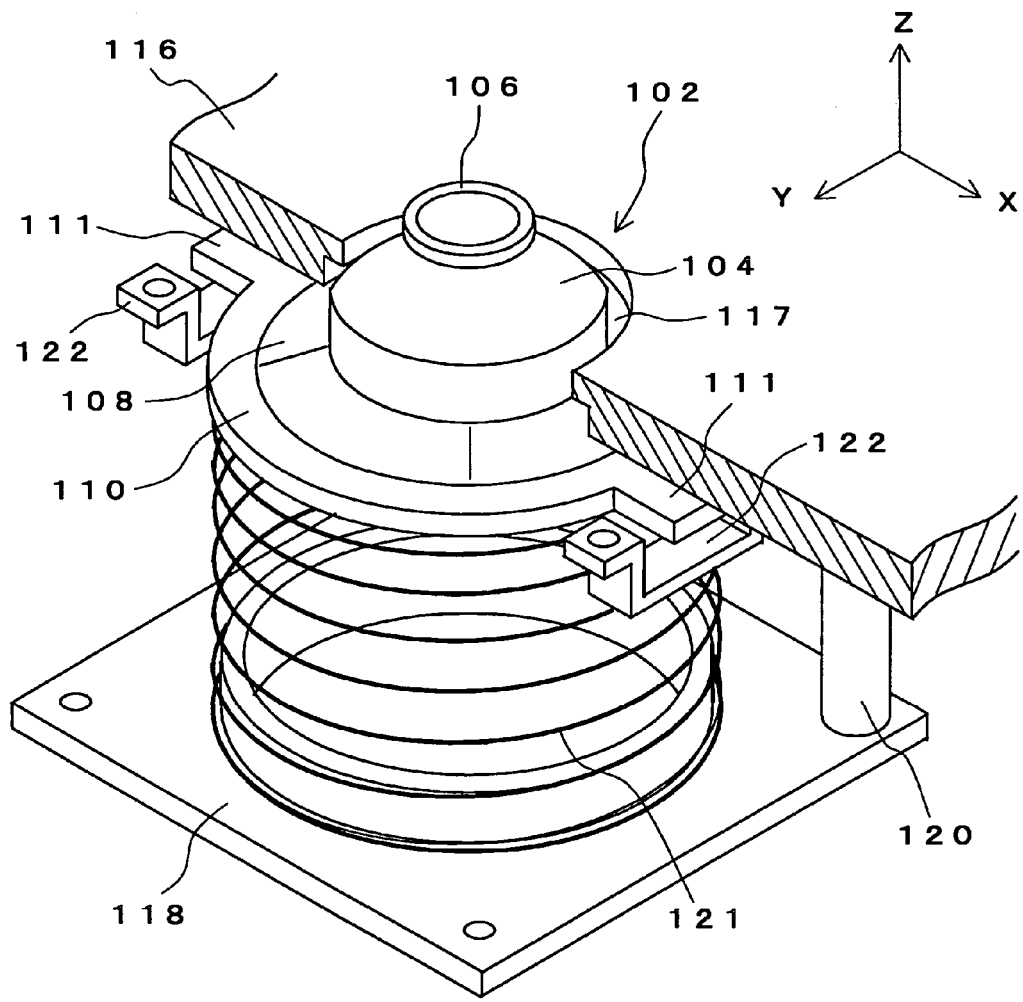
FIG. 4 is a partially cross-sectional perspective diagram for showing a configuration of an embodiment of a plug connector according to the invention.

FIG. 4 shows a configuration of an embodiment of the plug connector 102 according to the invention. Referring to FIGS. 3 and 4, the following will be described on this plug connector 102.

The plug connector 102 includes the convex portion 104 and a guide portion 108. The convex portion 104 has a sectional configuration of round arch, for example, a half of a sphere that is projecting, a diameter of which is gradually diminished along inserting direction thereof toward a forward end thereof. The convex portion 104 may have a tapered cone.

The convex portion 104 also has an orifice 109 at its forward end that projects cylindrically and the plug portion 106 formed at the forward end. The plug portion 106 is formed of a ring flat surface that is perpendicular to a center axis of the orifice 109.

The guide portion 108 includes an inclined surface enlarged from a bottom of the convex portion 104 along a circumference thereof. At an outer side of the guide portion 108, a flange portion 110 and a projecting part 111 for stopping rotation thereof are provided. The flange portion 110 is projected from a periphery of the guide portion 108 in a form of a ring. The projecting part 111 is projected from a part of the flange portion 110. In this case, two projecting parts 111 are projected from opposite positions of an outer periphery of the flange portion 110.

The plug connector 102 includes laser diode (LD) 112 as an optical element. The plug connector 102 has an attachment, which is not shown, for LD board 113 and the LD 112 is implemented on the LD board 113 that is attached to the plug connector 102.

The plug connector 102 includes a lens 114. A lens holder 115 is inserted into the orifice 109 of the plug connector 102. The lens 114 is attached in the lens holder 115 so that the laser diode 112 is positioned on an optical axis of the lens 114, thereby making light emitted from the laser diode 112 and incident to the lens 114 parallel.

The plug portion 106 has rigid accuracy in its respective portions so that the plug portion 106 can be perpendicular to the optical axis of the lens 114. It is noted that a coordinate along the optical axis of the lens 114 is referred to as "Z-axis" hereinafter and coordinates perpendicular to the Z-axis are referred to as "X-axis" and "Y-axis", respectively.

The plug connector 102 is housed in a case 116 of an optical communication device, which will be described later. The case has an opening 117. A supporting plate 118 constituting supporting mechanism is attached at a position opposed to the opening 117.

The opening 117 has a diameter that is larger than that of the convex portion 104 and is smaller than that of the guide portion 108. A step portion 119 for allowing the inclined surface of the guide portion 108 to be sided is formed at reverse surface of the case 116 just near the opening 117.

The supporting plate 118 is hanged from the reverse surface of the case 116 via supporting rods 120. The supporting plate 118 also supports the plug connector 102 via a spring 121. The spring 121 constitutes elastic member and is a coil spring, for example, having a diameter somewhat smaller than that of the flange portion 110 of the plug connector 102. An end of the spring 121 hooks a stopper 110a formed at a reverse surface of the flange portion 110 and the other end of the spring 121 catches a cylinder portion 118a formed on an upper surface of the supporting plate 118.

The convex portion 104 of the plug connector 102 is inserted into the opening 117 and pressed by the spring 121 so that the guide portion 108 is hit and connected an edge 116a of the reverse surface of the case 116 near the opening 117. Thus, the guide portion 108 and the flange portion 110 limit a moving amount of the plug connector 102 by the spring 121 along the Z-axis. When the guide portion 108 is hit and connected the edge 116a of the reverse surface of the case 116, the convex portion 104 projects from a surface of the case 116.

The case 116 has a restraining plate 122. The restraining plate 122 is attached at the reverse surface of the case 116 and encloses the projecting part 111 of the plug connector 102. The projecting part 111 is movable in the restraining plate 122 by a predetermined amount of movement. While the restraining plate 122 and the projecting part 111 limit an amount of movement in a pressed direction along Z-axis in the plug connector 102 and the rotation thereof, the plug connector 102 is supported so that it can be moved in an optional direction along the X-, Y-, and Z-axes.

The following will describe a configuration of the receptacle connector 103 referring to FIG. 3.

The receptacle connector 103 has a concave portion 105 having a circular opening from which a round recessed portion starts, the opening having a diameter into which the convex portion 104 of the plug connector 102 can be inserted. The concave portion 105 may be a cylindrical or conic concave portion.

There is an orifice 123 in a cylindrically projected bottom of the concave portion 105. A receptacle portion 107 is formed at a forward end of the cylindrically projected bottom. The receptacle portion 107 is composed of ring surface that is perpendicular to a center axis of the orifice 123.

The receptacle portion 107 of the receptacle connector 103 and the plug portion 106 of the plug connector 102 have the same diameter. When the plug connector 102 is inserted into the receptacle connector 103, the plug portion 106 is attached to the receptacle portion 107 and the convex portion 104 of the plug connector 102 is also attached to the concave portion 105 of the receptacle connector 103.

The receptacle connector 3 has a photodetector (PD) 125 as an optical element. The receptacle connector 3 includes an attachment, which is not shown, for a PD board 126 so that the photodetector 125 can be implemented on the PD board 126 that is attached to the receptacle connector 103.

The receptacle connector 3 has a lens 127. A lens holder 128 is attached into the orifice 123 of the receptacle connector 103. The lens holder 128 holds the lens 127 so that the photodetector 125 can be positioned along an optical axis of the lens 127. Light incident on the lens 127 from a plug connector side can be focused on the photodetector 125, which will be described later. The receptacle portion 107 has rigid accuracy in its respective portions so that the receptacle portion 107 can be perpendicular to the optical axis of the lens 127.

The receptacle connector 103 is housed in a case 129 of an optical communication device, which will be described later. The case 129 has an opening 130 to which the receptacle connector is inserted and secured.

Figure 5A:
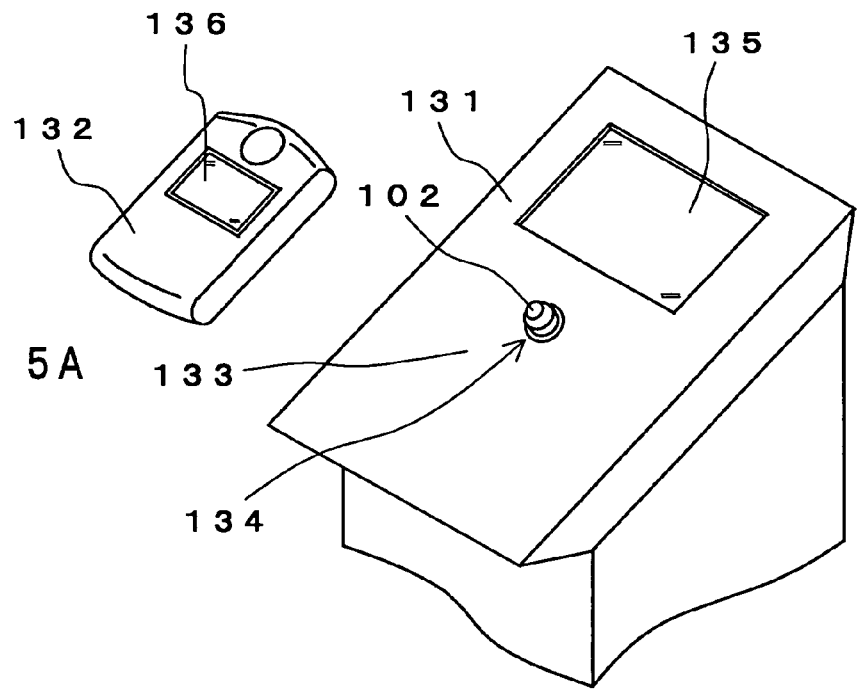
FIGS. 5A and 5B are perspective diagrams each for showing a configuration of a transmitter as an embodiment of an optical communication device according to the invention.
Figure 5B:
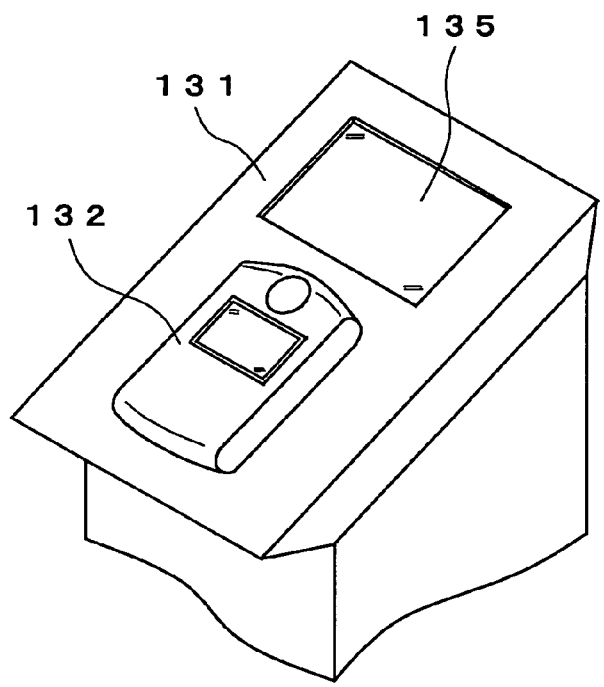

The following will describe a configuration of the optical communication devices referring to FIGS. 5A and 5B and 6A, 6B. The optical communication devices have the above optical connector assembly 101 detachably. FIGS. 5A and 5B illustrate a configuration of an embodiment of the optical communication device according to the present invention.

In this case, the connectors of the optical connector assembly 101 are respectively provided for one optical communication device as a transmitter 131 and the other optical communication device as a portable receiver 132. As shown in FIG. 5B, the portable receiver 132 is set on the transmitter 131 to transmit contents or the like from the transmitter 131 to the portable receiver 132 according to the optical communication.

Data transmission by the optical communication is performed as one-way communication, namely, from the transmitter 131 to the portable receiver 132. This allows the optical connector assembly 101, which has been described, with a simple configuration to perform the optical communication.

The transmitter 131 includes a placement portion 133 for the portable receiver 132 on its upper surface. Light-emission portion 134 is provided for the placement portion 133. In addition to the placement portion 133, display 135 may be provided. If the contents to be transmitted to the portable receiver 132 include image, the display 135 displays such the contents to be transmitted to the portable receiver 132.

It is noted that an arrangement of each part is determined so that the display 135 is prevented from disappearing when the portable receiver 132 is set on the placement portion 133 of the transmitter 131, as shown in FIG. 5B.

The plug connector 102 as shown in FIGS. 3 and 4 is provided for the light-emission portion 134. Namely, the placement portion 133 is formed on the case 116, which has been described referring to FIGS. 3 and 4, and the plug connector 102, which has a configuration described on FIGS. 3 and 4, is supported movably in the placement portion 133. The transmitter 131 has a board or the like on which a circuit for driving laser diode 112 that is attached on the plug connector 102 is formed.

Figure 6A:
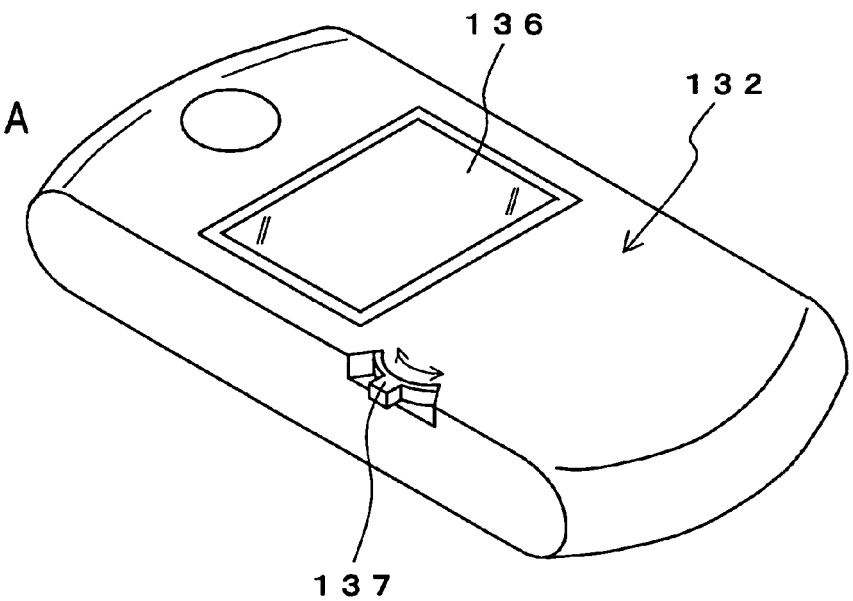
FIGS. 6A and 6B are perspective diagrams each for showing a configuration of a portable receiver as an embodiment of an optical communication device according to the invention.
Figure 6B:
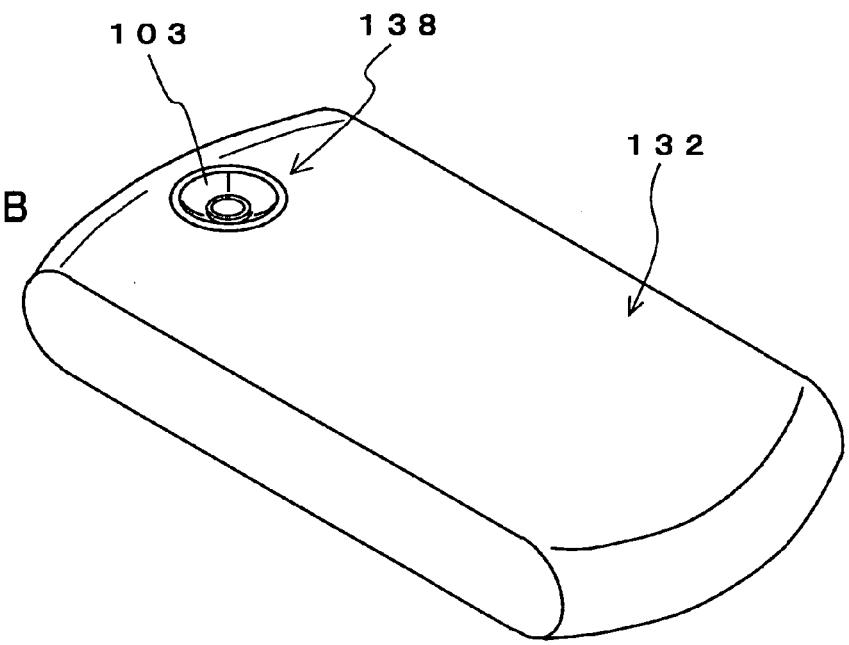

FIGS. 6A and 6B illustrate a configuration of an embodiment of the portable receiver 132 according to the present invention. FIG. 6A shows a perspective view of the portable receiver 132 outwardly shown from a front side thereof. FIG. 6B shows a perspective view of the portable receiver 132 outwardly shown from a rear side thereof.

As shown in FIG. 6A, the portable receiver 132 has a display 136 on its front portion. It also has an operating portion 137 for specifying the contents to be reproduced on the display.

As shown in FIG. 6B, the portable receiver 132 has a light-receiving portion 138 on its rear portion. The receptacle connector 103 described on FIG. 3 is provided for the light-receiving portion 138. Namely, a rear cover of the portable receiver 132 is composed of the case 129, which has been described on FIG. 3, and the receptacle connector is fixed thereon.

Thus, light-emission portion 134 of the transmitter 131 and the light-receiving portion 138 of the portable receiver 132 are connected detachably, so that the portable receiver 132 can receive laser light emitted from the transmitter 131. When a user sets the portable receiver 132 on the placement portion 133 of the transmitter 131 with the portable receiver 132 being roughly aligned on the transmitter 131, the fitting of the plug connector 102 and the receptacle connector 103 allows optical axes of light-emission side and light-receiving side to be aligned.

Thus, a user merely puts the portable receiver 132 on the placement portion 133 of the transmitter 131 to make composed such a system that the contents can be transmitted to the portable receiver 132.

Figure 7A:
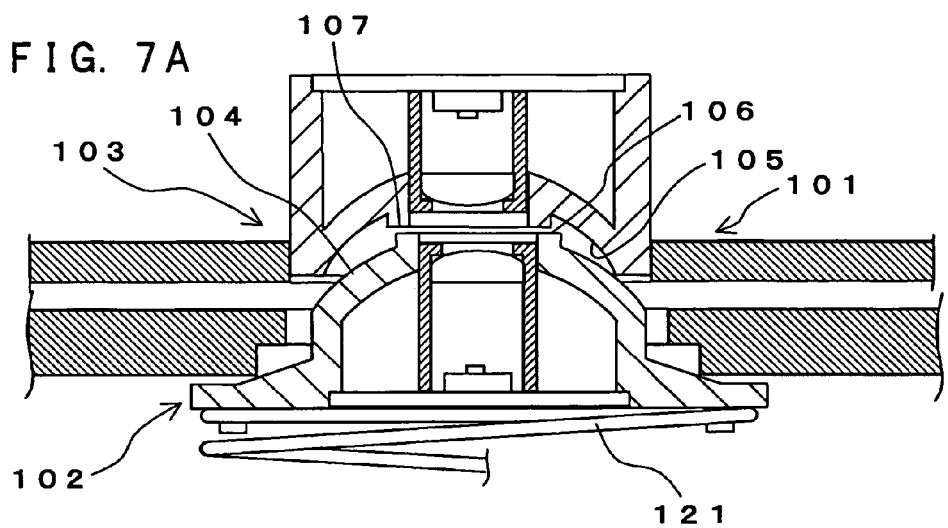
FIGS. 7A and 7B are partially cross-sectional perspective diagrams each for showing an operation of an embodiment of an optical connector assembly according to the invention.
Figure 7B:
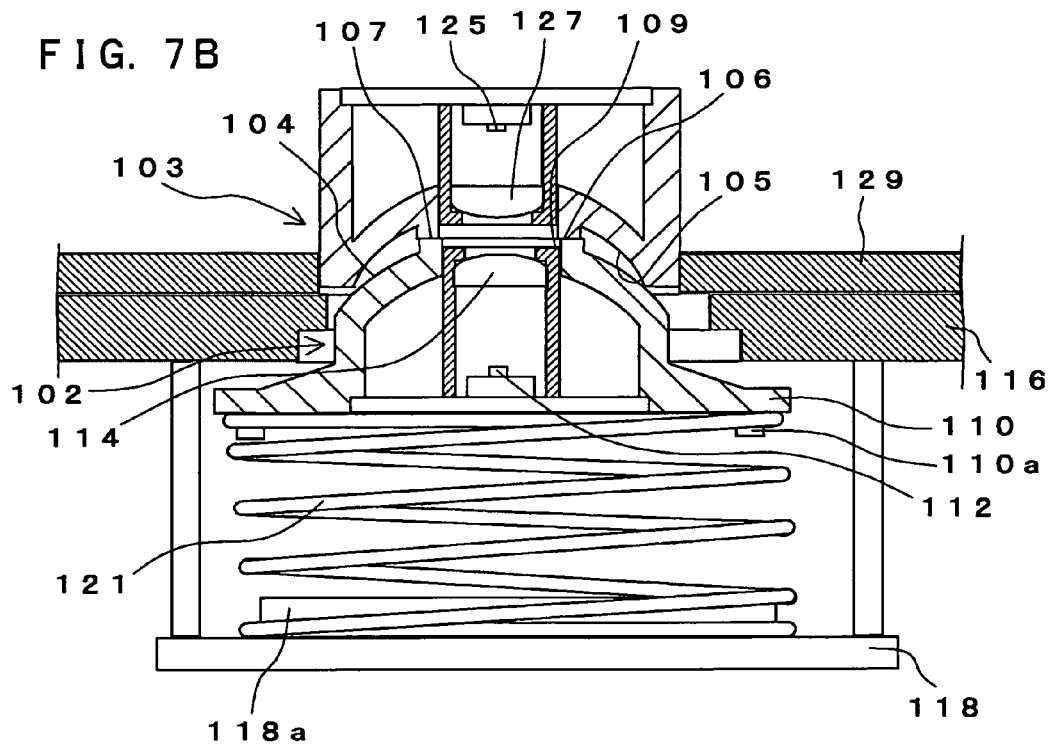
Figure 8:
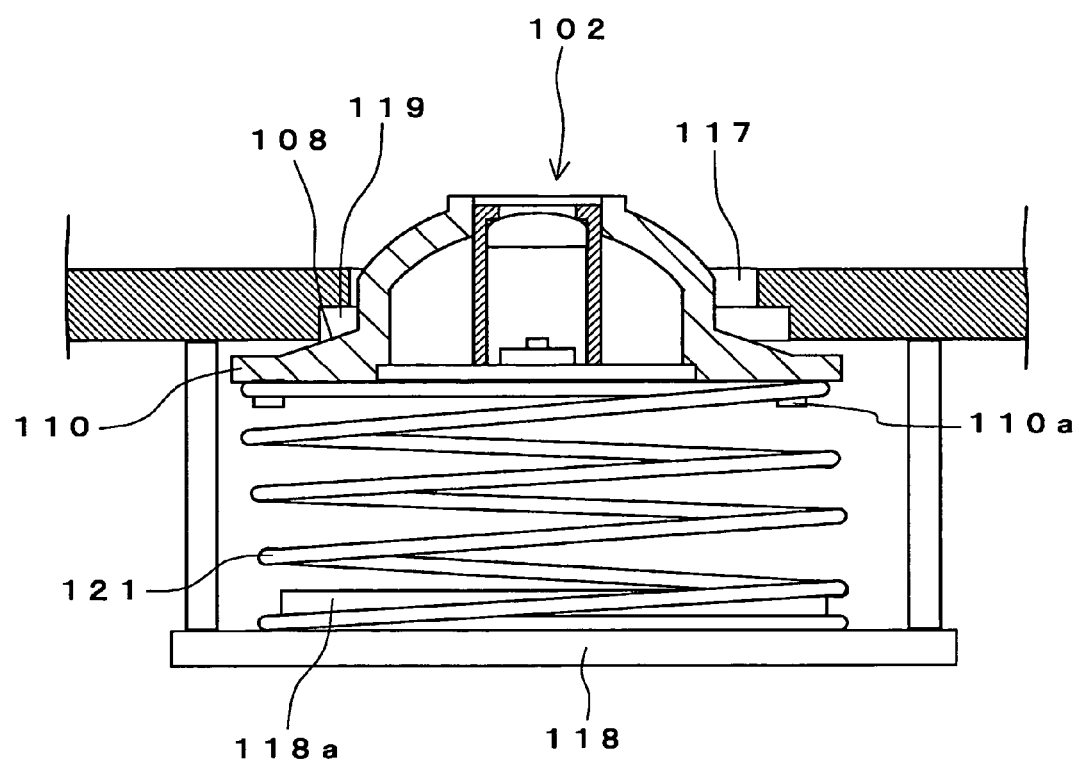
FIG. 8 is a partially cross-sectional perspective diagram for showing an operation of the embodiment of the optical connector assembly according to the invention.

The following will describe operations of the optical connector assembly 101 referring to FIGS. 7A, 7B and 8. It is noted that the connectors of the optical connector assembly 101 are respectively provided for one optical communication device as a transmitter 131 and the other optical communication device as a portable receiver 132.

A user merely puts the portable receiver 132 on the placement portion 133 of the transmitter 131. In this time, he or she makes the light-receiving portion 138 opposite to the light-emitting portion 134, and the receptacle connector 103 roughly aligned on the plug connector 102.

FIGS. 7A and 7B illustrate the optical connector assembly 101 with the receptacle connector 103 being somewhat shifted with respect to the plug connector 102 in an X-Y direction. If the receptacle connector 103 is somewhat shifted with respect to the plug connector 102 in a X-Y direction, when the user puts the portable receiver 132 on the placement portion 133 of the transmitter 131, the concave portion 105 of the receptacle connector 103 reaches and attaches a part of the convex portion 104 of the plug connector 102, as shown in FIG. 7A.

By the operation of putting the portable receiver 132 on the placement portion 133 of the transmitter 131, the plug connector 102 is pressed in a Z-axis direction with it moving within a movable range in any one of the X-axis direction and the Y-axis direction based on the shifting amount of the receptacle connector 103 because the receptacle connector 103 presses the convex portion 104 of the plug connector 102. This causes the spring 121 to be compressed by an elastic deformation.

Since an end of the spring 121 hooks a stopper 110a formed at a reverse surface of the flange portion 110 and the other end of the spring 121 catches a cylinder portion 118a formed on an upper surface of the supporting plate 118, the spring 121 is elastically deformed in a direction where the plug connector 102 inclines against accompanying movement of the plug connector 102 when the plug connector 102 moves in X-Y direction.

If the receptacle connector 103 is moved to the plug connector 102 exceeding its movable range with it being shifted in X-Y direction, the concave portion 105 of the receptacle connector 103 is guided along the convex portion 104 when the plug connector 102 moves against the opening 117 so that it is prevented from moving in X-Y direction at any more. This allows a position of the portable receiver itself to be corrected.

When the portable receiver 32 is set on the placement portion 133 of the transmitter 131 as shown in FIG. 5B, the cases 116 and 129 are connected with each other as shown in FIG. 7B.

In this condition, the spring has been compressed by elastic deformation, and the plug portion 106 of the plug connector 102 and the receptacle portion 107 of the receptacle connector 103 are attached to one another with them being pressed. As described above, the plug portion 106 has a surface that is perpendicular to the optical axis of the lens 114 and the receptacle portion 107 has a surface that is perpendicular to the optical axis of the lens 127.

Thus, when the plug portion 106 of the plug connector 102 and the receptacle portion 107 of the receptacle connector 103 are attached to one another, no inclination of the optical axis of the lens 127 of the receptacle connector 103 with respect to the optical axis of the lens 114 of the plug connector 103 occurs. An arrangement with the convex portion 104 of the plug connector 102 and the concave portion 105 of the receptacle connector 103 being fitted causes the axes of the lenses 114 and 127 to be almost aligned.

In this condition, the lens 114 converts laser light emitted from the laser diode 112 to parallel light to emit it from the orifice 109 of the plug connector 102. Laser light emitted from the plug connector 102 is made incident to the lens 127 through the orifice 123 of the receptacle connector 103 to be focused on the photodetector 125.

Figure 1:
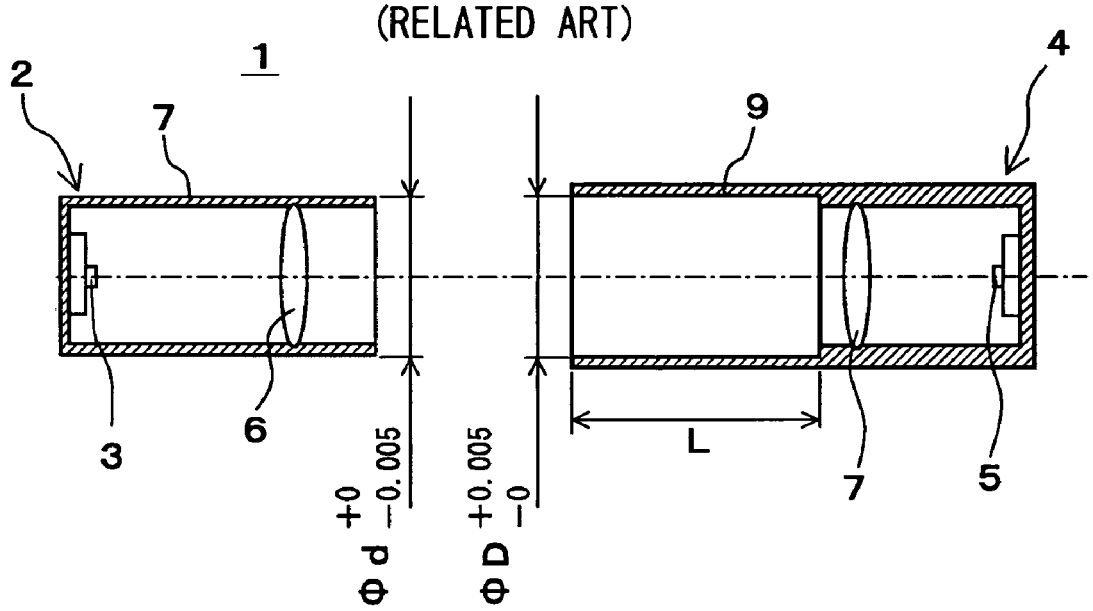
FIG. 1 is a side-sectional diagram for showing a configuration of an optical connector assembly according to related art.
Figure 2A:
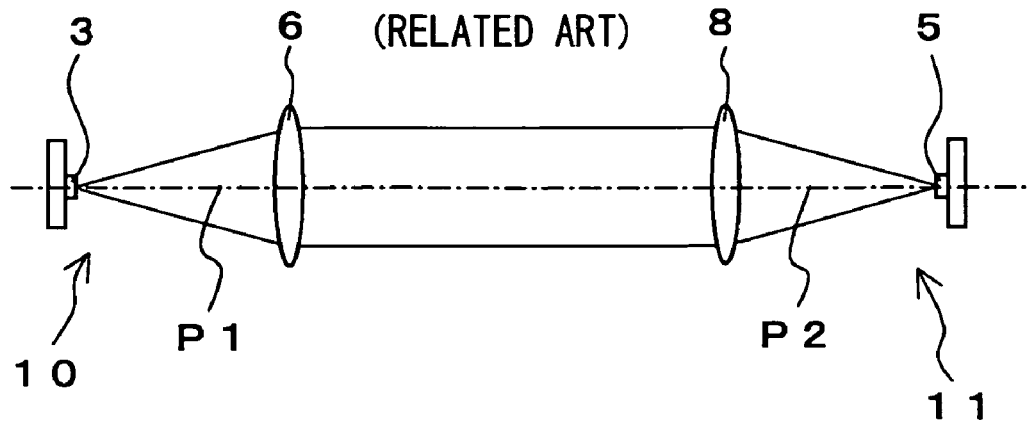
FIGS. 2A through 2C are diagrams each for explaining a connection in the optical connector assembly.
Figure 2B:
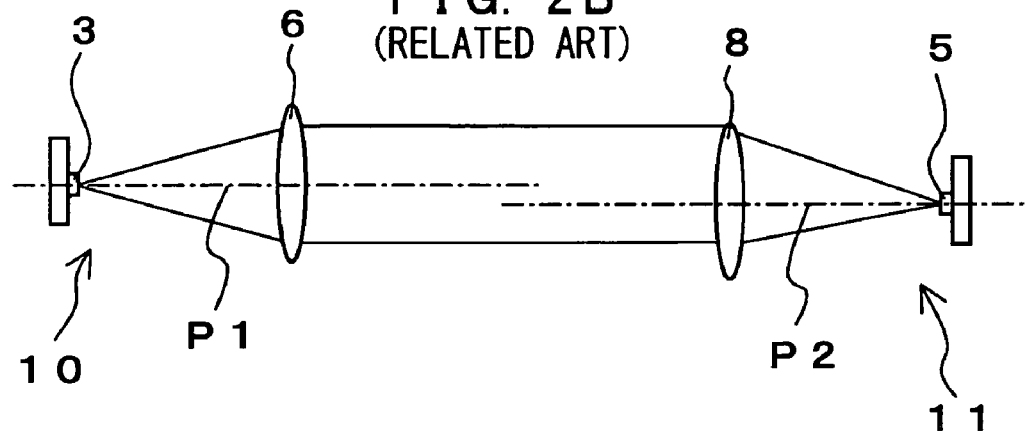
Figure 2C:
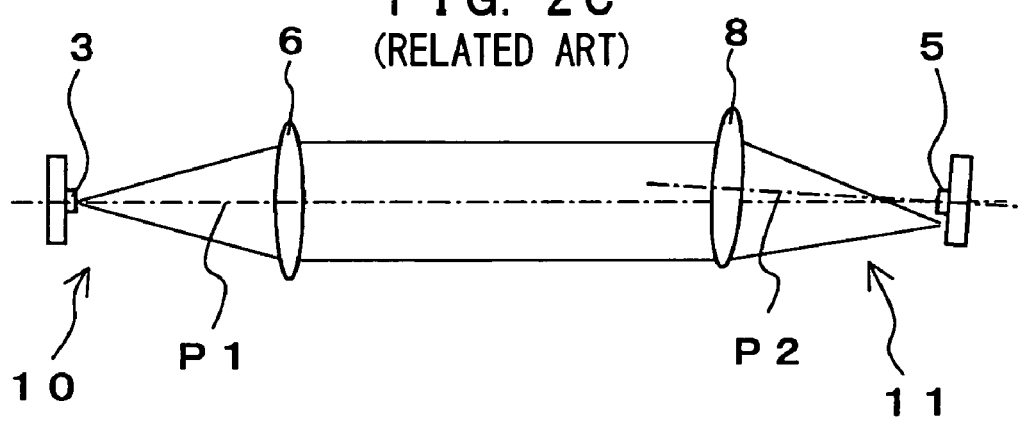

As described above on FIG. 2, if the optical axis of the lens 127 is inclined to that of the lens 114, laser light emitted from the laser diode 112 is not focused on the photodetector 125. On the other hand, in the optical connector assembly 101, since no inclination of the optical axis of the lens 127 with respect to the optical axis of the lens 114 occurs, laser light emitted from the laser diode 112 can be focused on the photodetector 125. It is noted that if the optical axis of the lens 127 is parallel to the optical axis of the lens 114, the laser light can be focused on the photodetector 125 when the optical axes are somewhat shifted.

Thus, when the portable receiver 132 is put on the placement portion 133 of the transmitter 131 with a position of the receptacle connector 103 being roughly fitted with respect to the plug connector 102, the plug connector moves with respect to the position of the receptacle connector 103. The plug connector 102 and the receptacle connector 103 are then connected with each other so that the optical axis of the lens 127 is made almost parallel to the optical axis of the lens 114.

This causes the contents or the like to be distributed from the transmitter 131 to the portable receiver 132 by the optical communication under its easy operations.

It is noted that in the optical connector assembly 101 of this embodiment, a size and a shape of each part of the plug connector 102 or the receptacle connector 103 can be set so that a distance between the laser diode 112 and the photodetector 125 becomes about 1 though 10 mm.

In such the proximal optical communication, only one lens on each of the connectors is provided corresponding to the optical element, and by using only these two lenses through which the laser light is transferred to the photodetector 125, optical communication can be performed.

This eliminates optical system such as a plurality of lenses and a mirror relative to each connector, thereby implementing the lightweight optical connector assembly and the like having a simple configuration at low cost. Particularly, in the portable receiver, such the lightweight connector is used, thereby improving its portability. Since weak laser diode of class 1 can be used as the laser diode 12, it is possible to improve safety of a side of the transmitter 131.

The laser diode 112 is connected with a board, which is not shown, by a cable. If the plug connector 102 rotates around the Z-axis freely, the plug connector 102 may also rotate while the receptacle connector 103 are attached and detached repeatedly, so that the cable can be twisted and cut. This causes a rotation of the plug connector 102 to be restrained by the projecting part 111 and the restraining plate 122.

When the portable receiver 132 is detached from the transmitter 131, the user may lift the portable receiver 132 therefrom. Since the plug connector 102 and the receptacle connector 103 are connected with fitness of the convex portion 104 and the concave portion 105, it is easily possible to detach the receptacle connector 103 from the plug connector 102 by only lifting the portable receiver 132.

When the receptacle connector 103 is detached, the plug connector 102 is lifted upwardly by memory of the spring 121 as shown in FIG. 8. The guide portion 108 is attached to the opening 117 of the case 116. If the portable receiver 132 is set with a position of the receptacle connector 103 being shifted in X-Y direction with respect to the plug connector 102, as shown in FIGS. 7A and 7B, the plug connector 102 is positioned at an eccentric position in the opening 117.

If from this condition, the portable receiver 132 is lifted up and the plug connector 102 is also lifted upwardly by the memory of the spring 121, the attachment of the guide portion 108 and the opening 117 causes the plug connector 102 to be returned to its original position near a center of the opening 117.

This allows the plug connector 102 to be positioned at almost center of the opening 117 when the portable receiver 132 is not set on the placement portion 133 of the transmitter 131. Therefore, an almost uniform clearance space between the plug connector 102 and an edge of the orifice 117 is given, thereby obtaining a handsome seen thereto.

This one-way communication from the transmitter 131 to the portable receiver 132 in the optical communication devices enables the transmitter 131 and the portable receiver 132 to have a pair of light-emission element and light-receiving element. When the plug connector 102 and the receptacle connector 103 are connected with each other, the convex portion 104 having sectional configuration of round arch is attached to the concave portion 105 also having round surface. Thus, they are attached at their round portions. This allows the plug connector 102 and the receptacle connector 103 to be connected without regard to any direction of the portable receiver 132.

Position alignment accuracy of the optical axes in the optical connector assembly 101 is based on accuracy of each of the plug portion 106 and the receptacle portion 107. Therefore, in the plug connector 102, accuracy of the plug portion 106 is improved with respect to the optical axis of the lens 114 and in the receptacle connector 103, accuracy of the receptacle portion 107 is also improved with respect to the optical axis of the lens 127, thereby maintaining excellent alignment accuracy of the optical axes relative to their inclination in the optical connector assembly 101.

Thus, position alignment accuracy of the optical axes relative to their inclination in the optical connector assembly 101 can be adjusted in isolation from a tolerance of size of each of the plug portion 106 and the receptacle portion 107. This enables an optical connector assembly and the like having excellent accuracy to be provided in low cost.

When attaching or detaching the plug connector to or from the receptacle connector, the plug portion 106 is not almost slid to the receptacle portion 107, so that a little friction occurs between them if repeating the attachment and detachment thereof. This allows excellent alignment accuracy of the optical axes to be maintained for a long time.

Although it has been described that the transmitter 131 has the plug connector 102 and the portable receiver 132 has the receptacle connector 103, the transmitter 131 may have the receptacle connector 103 and the portable receiver 132 may have the plug connector 102. In this case, the laser diode 112 is provided for the receptacle connector 103 and the photodetector 125 is provided for the plug connector 102.

If, however, an individual customer possesses the portable receiver 132, the portable receiver having no convex portion is comfortable when carrying it. Thus, if so, the portable receiver 132 may have the receptacle connector 103.

Any one of the plug portion 106 and the receptacle portion 107 can be moved. If an individual customer possesses the portable receiver 132 and the transmitter 131 is set on the street or the like, the portable receiver 132 is desirable to be lower cost. Therefore, a movable portion may be included in the transmitter 131.

Although it has been described that the plug connector 102 is supported by the coil spring, the connector may be supported by other elastic member such as leaf spring and rubber. Further, the plug connector 102 can be supported by utilizing an attraction or repulsion by a magnet. It is noted that if using the coil spring, when the plug connector 102 moves in X-Y directions, it can move by like force to any of the directions, thereby enable user to feel quite normal in his or her attaching or detaching operation. Also, such the optical 2Z connector assembly or the like has simple configuration.

In the optical communication devices including the optical connector assembly 101, i.e., the plug connector 102 or the receptacle connector 103, digital versatile disc (DVD) recorder or hard disc recorder that are intended for home may be used as the transmitter.

The following will describe a second embodiment of an optical connector assembly of the invention.

Figure 9:
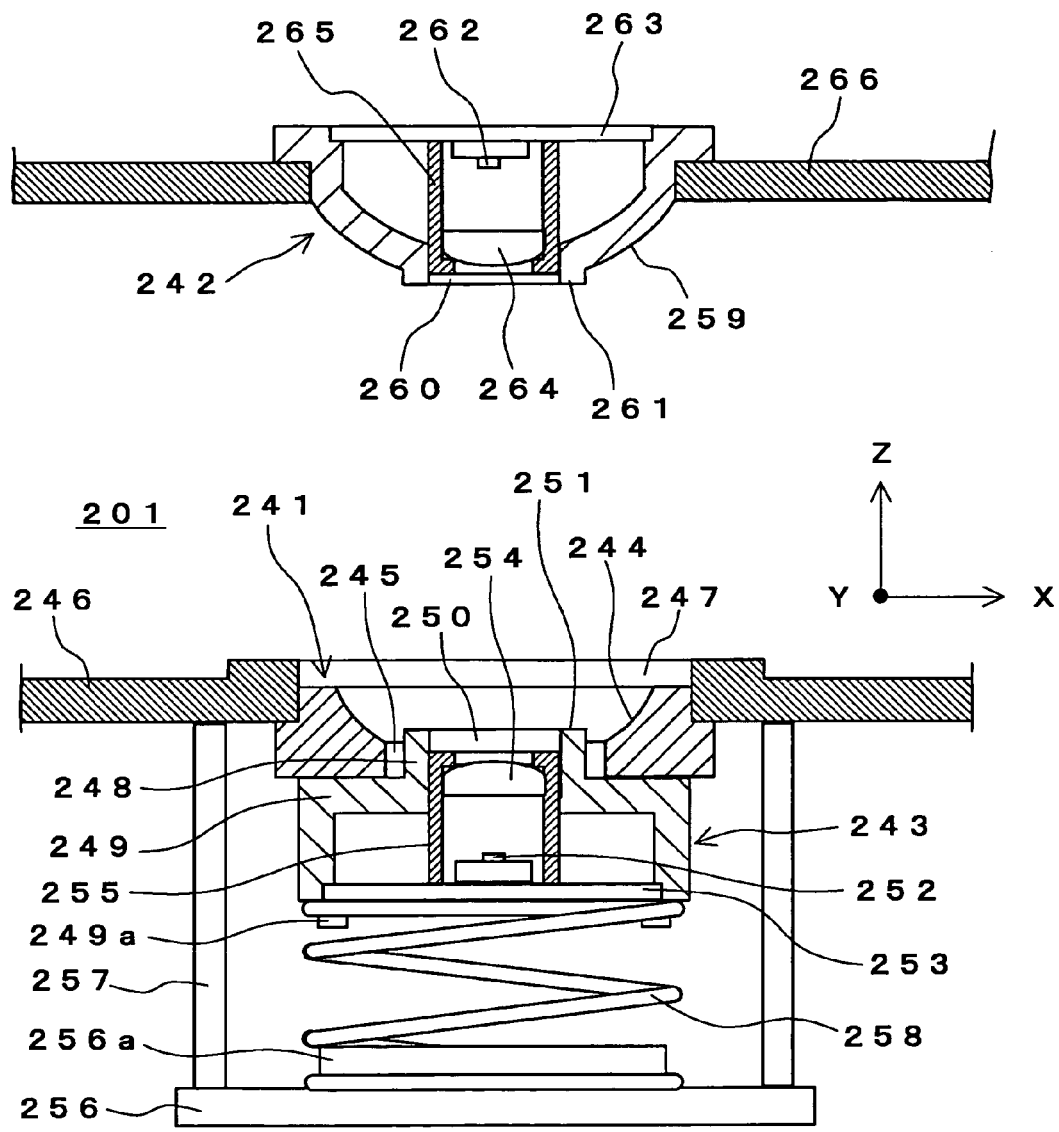
FIG. 9 is partially cross-sectional perspective diagram for showing a configuration of another embodiment of an optical connector assembly according to the invention.

FIG. 9 shows a configuration of a second embodiment of an optical connector assembly 201 according to the invention. The optical connector assembly 201 includes a receptacle connector 241 and a plug connector 242, which have an optical element, respectively. In the embodiment, the receptacle connector includes a movable holder 243 and when the plug connector 242 is inserted into the receptacle connector 241, optical axes of their optical systems can be aligned.

Using FIG. 9, a configuration of the receptacle connector 241 will be described in detail. The receptacle connector 241 has a concave portion 244 having a circular opening from which a round recessed portion starts, and a circular orifice 245 at its bottom. The concave portion 244 may have a cylindrical or conic recessed portion.

The receptacle connector is attached to a case 246 composed of the transmitter 131, for example, which has been described with reference to FIG. 5. The case has an opening 247 and the receptacle connector 241 is fixed in the opening 247. The receptacle connector 241 may be integrally formed with the case 246.

The movable holder 243 has a cylindrically projecting portion 248 and a flange portion 249. An orifice 250 is formed in the cylindrically projecting portion 248. A receptacle portion 251 is formed at a forward end of the projecting portion 248. The receptacle portion 251 is composed of ring surface that is perpendicular to a center axis of the orifice 250. The plug connector 248 has a smaller diameter than that of the orifice 245 of the receptacle connector 241 and the flange portion 246 has a larger diameter than that of the orifice 245.

The movable holder 243 has laser diode 252 as an optical element. The movable holder 243 includes an attachment, which is not shown, for a LD board 253 so that the laser diode 252 can be implemented on the LD board 253 that is attached to the movable holder 243.

The movable holder 243 also has a lens 254. A lens holder 255 is attached into the orifice 250 of the movable holder 243. The lens holder 255 holds the lens 254 so that the laser diode 252 can be positioned along an optical axis of the lens 254. Light emitted from the laser diode 252 is made incident on the lens 254 so that the light becomes parallel light.

The receptacle portion 251 has rigid accuracy in its respective portions so that the receptacle portion 251 can be perpendicular to the optical axis of the lens 254. It is noted that a coordinate along the optical axis of the lens 254 is referred to as "Z-axis" hereinafter and coordinates perpendicular to the Z-axis are referred to as "X-axis" and "Y-axis", respectively.

The receptacle connector 241 is housed in the case 246 having a supporting plate 256 constituting supporting mechanism that is attached at a position opposed to the receptacle connector 241. The supporting plate 256 is hanged from the reverse surface of the case 246 via supporting rods 257. The supporting plate 256 also supports the movable holder 243 via a spring 258. The spring 258 is a coil spring, for example. An end of the spring 258 hooks a stopper 249a formed at a reverse surface of the flange portion 249 of the movable holder 243 and the other end of the spring 258 catches a cylinder portion 256a formed on an upper surface of the supporting plate 256.

The projecting portion 248 of the movable holder 243 is inserted into the orifice 245 of the receptacle connector 241 and the flange portion 249 is pressed by the spring 258 so that the movable holder 243 is hit and connected to the reverse surface of the receptacle connector 241. Thus, the flange portion 249 limits a moving amount of the movable holder 243 by the spring 258 along the Z-axis. When the flange portion 249 is hit and connected to the reverse surface of the receptacle connector 241, the receptacle portion 251 projects from a bottom of the concave portion 244.

Like the plug connector 102 of the optical connector assembly 101 of the first embodiment, the optical connector assembly 201 also has a restraining mechanism for restraining an amount of movement in a pressed direction of the movable holder 243 and the rotation thereof.

Using FIG. 9, a configuration of the plug connector 242 will be described in detail. The plug connector 242 includes the convex portion 259. The convex portion 259 has a sectional configuration of round arch, for example, a half of a sphere that is projecting, a diameter of which is gradually diminished along inserting direction thereof toward a forward end thereof. The convex portion 259 has such a diameter that it can insert the concave portion 244 of the receptacle connector 241. The convex portion 259 may have a tapered cone.

The convex portion 259 also has an orifice 260 at its forward end that projects cylindrically and the plug portion 261 formed at the forward end. The plug portion 261 is formed of a ring flat surface that is perpendicular to a center axis of the orifice 260.

The receptacle portion 251 of the receptacle connector 241 and the plug portion 261 of the plug connector 242 have the same diameter. When the plug connector 242 is inserted into the receptacle connector 241, the plug portion 261 is attached to the receptacle portion 251 and the convex portion 259 of the plug connector 242 is also attached to the concave portion 244 of the receptacle connector 241.

The plug connector 242 includes a photodetector 262 as an optical element. The plug connector 242 has an attachment, which is not shown, for PD board 263 and the photodetector 262 is implemented on the PD board 263 that is attached to the plug connector 242.

The plug connector 242 includes a lens 264. A lens holder 265 is inserted into the orifice 260 of the plug connector 242. The lens 264 is attached in the lens holder 265 so that the photodetector 262 is positioned on an optical axis of the lens 264, thereby making light incident on the lens 264 from a side of the receptacle connector 241 parallel, which will be described later. The plug portion 261 has rigid accuracy in its respective portions so that a surface of the plug portion 261 can be perpendicular to the optical axis of the lens 264.

The plug connector 242 is attached to a case 266 composed of the portable receiver 132, for example, which has been described with reference to FIG. 5. The case 266 has an opening and the plug connector 242 is fixed in the opening.

Figure 10:
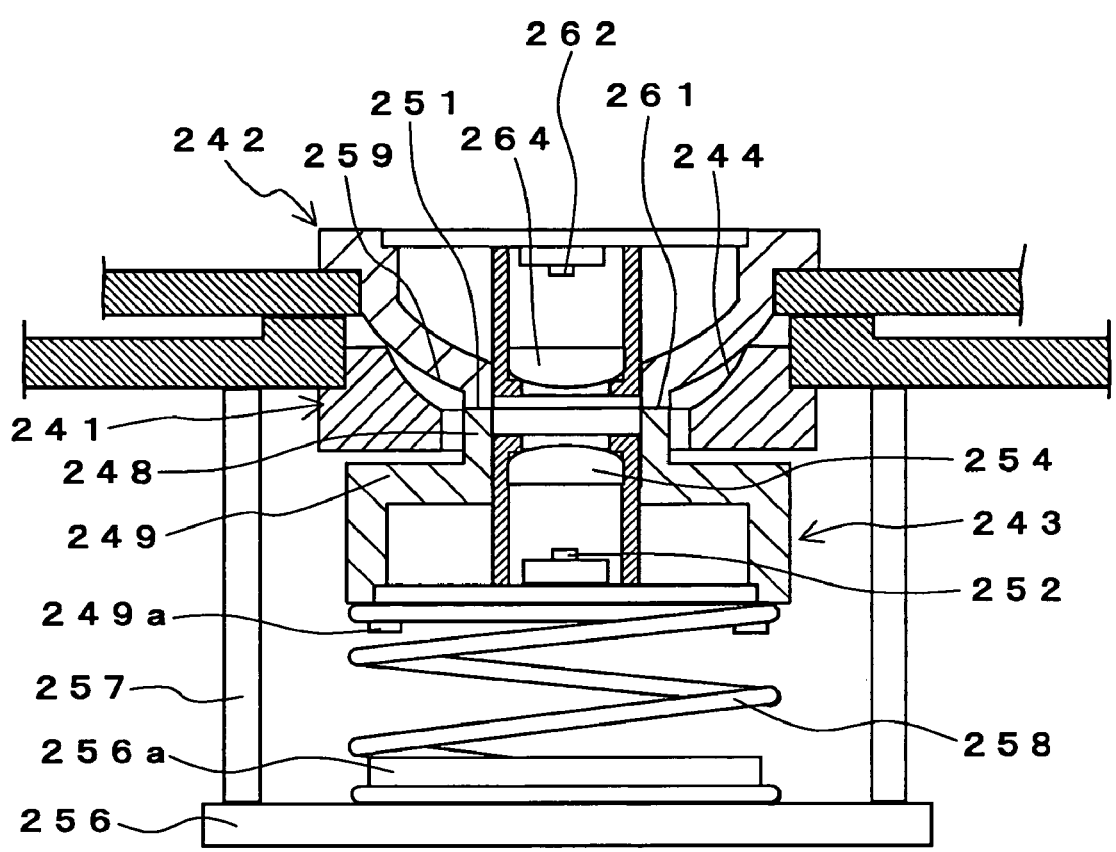
FIG. 10 is a partially cross-sectional perspective diagram for showing an operation of the another embodiment of the optical connector assembly according to the invention.

The following will describe operations of the optical connector assembly 201 referring to FIG. 10. It is assumed that the connectors of the optical connector assembly 201 are respectively provided for the transmitter 131 and the portable receiver 132, which have been described with reference to FIGS. 5A, 5B and 6A, 6B.

A user merely puts the portable receiver 132 on the placement portion 133 of the transmitter 131. In this time, he or she makes the light-receiving portion 138 opposite to the light-emitting portion 134, and the plug connector 242 roughly aligned on the receptacle connector 241.

By the operation of putting the portable receiver 132 on the placement portion 133 of the transmitter 131, the concave portion 244 of the receptacle connector 241 contacts a part of the convex portion 259 of the plug connector 242. The convex portion 259 of the plug connector 242 is guided along a surface of the concave portion 244 so that a surface of the portable receiver 232 can be corrected to align the optical axis of the lens 264 of the plug connector 242 with that of lens 254 of the receptacle connector 241.

The plug portion 261 of the plug connector 242 is then contacted with the receptacle portion 251 of the receptacle connector 241 to press movable holder 243 in a direction along Z-axis. This causes the spring 258 to be elastically deformed in a compressing direction thereof, thereby pressing the receptacle portion 251 against the plug portion 261.

As described above, the receptacle portion 251 has a surface that is perpendicular to the optical axis of the lens 254 and the plug portion 261 has a surface that is perpendicular to the optical axis of the lens 264.

Thus, when the receptacle portion 251 and the plug portion 261 are attached to one another, no inclination of the optical axis of the lens 264 of the plug connector 242 with respect to the optical axis of the lens 254 of the receptacle connector 241 occurs. An arrangement the concave portion 244 of the receptacle connector 241 and the convex portion 259 of the plug connector 242 with them being fitted causes the axes of the lenses 254 and 264 to be almost aligned.

If the movable holder 243 is inclined, no inclination of the optical axis of the lens 264 of the plug connector 242 with respect to the optical axis of the lens 254 of the receptacle connector 241 occurs when the receptacle portion 251 and the plug portion 261 are attached to one another.

In this condition, the lens 254 converts laser light emitted from the laser diode 252 to parallel light to emit it from the orifice 250 of the movable holder 243. Laser light emitted from the movable holder 243 is made incident to the lens 264 through the orifice 260 of the plug connector 242 to be focused on the photodetector 262.

Thus, when the portable receiver 132 is put on the placement portion 133 of the transmitter 131 with a position of the plug connector 242 being roughly aligned with respect to the receptacle connector 241, the portable receiver 132 is guided so that the receptacle connector 241 and the plug connector 242 are then connected with each other, thereby making the optical axis of the lens 264 of the plug connector 242 almost parallel with respect to the optical axis of the lens 254 of the receptacle connector 241.

This causes the contents or the like to be distributed from the transmitter 131 to the portable receiver 132 by the optical communication under its easy operations.

When the portable receiver 132 is detached from the transmitter 131, the user may lift the portable receiver 132 therefrom. Since the plug connector 102 and the receptacle connector 103 are connected with the concave portion 244 and the convex portion 259 being fitted, it is easily possible to detach the plug connector 242 from the receptacle connector 241 by only lifting the portable receiver 132.

When the plug connector 242 is detached, the movable holder 243 is lifted upwardly by memory of the spring 258. It returns to its original position that the flange portion 249 contacts the reverse surface of the receptacle connector 241.

The plug connector 242 and the receptacle connector 241 is connected with the convex portion 259 having a sectional configuration of round arch and the concave portion 244 having a round surface being contacted in the optical connector assembly 201 of this second embodiment. This allows the plug connector 242 and the receptacle connector 241 to be connected with each other independently of a connection direction of the portable receiver 232.

The movable holder 243 may have a guide portion that has been described with reference to the optical connector assembly 101 of the first embodiment.

The movable holder 243 may be provided for the plug connector 242.

Thus have been described the optical connector assemblies that are applied to the devices for optical communication, which are often attached and detached. It should be understood by those skilled in the art that various modifications, combinations, sub-combinations and alternations may occur depending on design requirements and other factors insofar as they are within the scope of the appended claims or the equivalents thereof.

What is claimed is:

1. An optical connector assembly which connects optical communication devices detachably to each other, said assembly comprising:
    a plug connector having a first optical element for pciforming any one of emission and receipt of light, and a first lens, the first optical element and the first lens having a first optical axis identical to each other; and
    a receptacle connector having a second optical element for performing the remained one of the emission and receipt of light, and a second lens, the second optical element and the second lens having a second optical axis identical to each other,
    wherein the plug connector includes a convex portion having sectional configuration of round arch a diameter of which is gradually diminished along the first optical axis, and a plug portion formed on a forward end of the convex portion, said plug portion being perpendicular to the first optical axis,
    wherein the receptacle connector includes a concave portion into which the convex portion is inserted and a receptacle portion formed in a bottom of the concave portion, said receptacle portion being perpendicular to the second optical axis, wherein any one of the plug connector and the receptacle connector has supporting mechanism that supports the connector movably, and wherein the curvature of the convex portion of the plug differs from the curvature of the concave portion of the receptacle such that, when the concave portion and convex portion are brought into contact, the convex portion contacts only an outer edge of the concave portion.

2. The optical connector assembly according to claim 1, wherein the supporting mechanism includes an elastic member that supports any one of the plug connector and the receptacle connector movably in any one of a direction along any one of the first and second optical axes and a direction which is traversed to any one of the first and second optical axes.

3. The optical connector assembly according to claim 2, wherein the elastic member includes a coil spring having elasticity along any one of the first and second optical axes.

4. The optical connector assembly according to claim 1, wherein any one of the plug connector and the receptacle connector which is supported by the supporting mechanism has guide portion which returns a position of any one of the plug connector and the receptacle connector to their original position.

5. The optical connector assembly according to claim 1, wherein any one of the plug connector and the receptacle connector includes movable holder that is independently moved, said movable holder having any one of the first and second optical elements, any one of the first and second lenses, and any one of the plug portion and the receptacle portion.

6. An optical communication device which performs optical communication, said device having an optical connector assembly, said assembly comprising:

a plug connector having an optical element for performing any one of emission and receipt of light, and a lens, said optical element and the lens having an optical axis identical to each other, wherein the plug connector includes a convex portion having sectional configuration of round arch a diameter of which is gradually diminished along the optical axis, and a plug portion formed on a forward end of the convex portion, said plug pardon being perpendicular to the optical axis.

7. The optical communication device according to claim 6 further comprising a supporting mechanism that supports the plug connector movably.

8. The optical communication device according to claim 7, wherein the supporting mechanism includes an elastic member that supports the plug connector movably in any one of a direction along the optical axis and a direction which is traversed to the optical axes.

9. The optical communication device according to claim 8, wherein the elastic member includes a coil spring having elasticity along the optical axis.

10. The optical communication device according to claim 7, wherein the plug connector which is supported by the supporting mechanism has guide portion which returns a position of the plug connector to its original position.

11. The optical communication device according to claim 7, wherein the plug connector includes movable holder that is independently moved, said movable holder having the optical element, the lens, and the plug portion; and wherein the supporting mechanism supports the movable holder movably.

12. An optical communication device which performs optical communication, said device having an optical connector assembly, said assembly comprising:

a receptacle connector having an optical element for performing any one of emission and receipt of light, and a lens, said optical element and the lens having an optical axis identical to each other, wherein the receptacle connector includes a concave portion having sectional configuration of round arch a diameter of which is gradually diminished along the optical axis, and a receptacle portion formed in a bottom of the concave portion, said receptacle portion being perpendicular to the optical axis.

13. The optical communication device according to claim 12 further comprising a supporting mechanism tat supports the receptacle connector movably.

14. The optical communication device according to claim 13, wherein the supporting mechanism includes an elastic member that supports the receptacle connector movably in any one of a direction along the optical axis and a direction which is traversed to the optical axis.

15. The optical communication device according to claim 14, wherein the elastic member includes a coil spring having elasticity along the optical axis.

16. The optical communication device according to claim 13, wherein the receptacle connector which is supported by the supporting mechanism has guide portion which returns a position of the receptacle connector to its original position.

17. The optical communication device according to claim 13, wherein the receptacle connector includes movable holder that is independently moved, said movable holder having the optical element, the lens, and the receptacle portion; and wherein the supporting mechanism supports the movable holder movably.

18. An optical connector assembly comprising:

a plug connector having a first optical axis longitudinal to the plug connector, a convex portion substantially perpendicular to the first optical axis and a plug portion formed on a forward end of the convex portion, said convex portion having a first curvature; and a receptacle connector having a second optical axis longitudinal to the receptacle connector, a concave portion substantially perpendicular to the second optical axis and a receptacle portion formed on a forward end of the concave portion, said concave portion having a second curvature different from the first curvature; and a spring to urge the concave portion to mate with the convex portion, wherein, when the concave portion of the receptacle and convex portion of the plug are brought into contact the convex portion contacts only an outer edge of the concave portion.

19. The optical connector of claim 18, wherein the first optical axis and the second optical axis are aligned substantially and inclination therebetween is prevented when the convex portion and concave portion are fitted together.

* * * * *